(12) United States Patent
Colinge et al.

(10) Patent No.: US 10,872,776 B2
(45) Date of Patent: Dec. 22, 2020

(54) STRUCTURE AND FORMATION METHOD OF SEMICONDUCTOR DEVICE STRUCTURE

(71) Applicant: TAIWAN SEMICONDUCTOR MANUFACTURING CO., LTD., Hsinchu (TW)

(72) Inventors: Jean-Pierre Colinge, Hsinchu (TW); Carlos H. Diaz, Mountain View, CA (US)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/711,542

(22) Filed: Sep. 21, 2017

(65) Prior Publication Data
US 2018/0012769 A1    Jan. 11, 2018

Related U.S. Application Data

(62) Division of application No. 14/856,875, filed on Sep. 17, 2015, now Pat. No. 9,779,959.

(51) Int. Cl.
*H01L 21/308*    (2006.01)
*H01L 29/78*    (2006.01)
(Continued)

(52) U.S. Cl.
CPC ......... *H01L 21/3085* (2013.01); *H01L 21/31* (2013.01); *H01L 21/311* (2013.01);
(Continued)

(58) Field of Classification Search
CPC ............ H01L 29/7851; H01L 29/4236; H01L 29/6656
See application file for complete search history.

(56) References Cited

U.S. PATENT DOCUMENTS 8,524,592 B1    9/2013 Xie et al.
9,502,416 B1 *  11/2016 Kim .................... H01L 27/1116
(Continued)

FOREIGN PATENT DOCUMENTS

CN    1638145 A    7/2005
CN    103383918 A    11/2013
(Continued)

OTHER PUBLICATIONS

Chinese Office Action dated Jan. 4, 2019 in corresponding Chinese application No. 201510860099.

*Primary Examiner* — Wael M Fahmy
*Assistant Examiner* — Sarah K Salerno
(74) *Attorney, Agent, or Firm* — Birch, Stewart, Kolasch & Birch, LLP

(57) ABSTRACT

Structures and formation methods of a semiconductor device structure are provided. The semiconductor device structure includes a fin structure over a semiconductor substrate. The semiconductor device structure also includes a gate stack covering a portion of the fin structure. The semiconductor device structure further includes a spacer element over a sidewall of the gate stack. The spacer element includes a first layer and a second layer over the first layer. The dielectric constant of the first layer is greater than the dielectric constant of the second layer. A gate dielectric layer of the gate stack adjoins the first layer and the second layer.

20 Claims, 14 Drawing Sheets

(51) Int. Cl.
*H01L 29/66* (2006.01)
*H01L 29/423* (2006.01)
*H01L 21/311* (2006.01)
*H01L 21/31* (2006.01)

(52) U.S. Cl.
CPC .... *H01L 29/4236* (2013.01); *H01L 29/66545* (2013.01); *H01L 29/66553* (2013.01); *H01L 29/66795* (2013.01); *H01L 29/785* (2013.01); *H01L 29/7848* (2013.01)

(56) References Cited

U.S. PATENT DOCUMENTS

| | | |
|---|---|---|
| 2004/0235300 A1 | 11/2004 | Mathew |
| 2008/0001187 A1* | 1/2008 | Booth ............... H01L 29/66795 257/288 |
| 2008/0237726 A1* | 10/2008 | Dyer ............... H01L 21/823864 257/369 |
| 2009/0206406 A1* | 8/2009 | Rachmady ........ H01L 21/28114 257/365 |
| 2012/0003806 A1 | 1/2012 | Wang |
| 2013/0056837 A1* | 3/2013 | Ng .................... H01L 21/82380 257/410 |
| 2013/0187229 A1* | 7/2013 | Cheng ................. H01L 29/0847 257/347 |
| 2013/0277686 A1 | 10/2013 | Liu |
| 2014/0134836 A1 | 5/2014 | Pranatharthiharan |
| 2014/0335673 A1* | 11/2014 | Kim .................. H01L 29/66545 438/283 |
| 2014/0349452 A1* | 11/2014 | Wang ............. H01L 21/823468 438/238 |
| 2015/0021681 A1* | 1/2015 | Hou ................ H01L 21/823807 257/330 |

FOREIGN PATENT DOCUMENTS

| | | |
|---|---|---|
| CN | 104064572 A | 9/2014 |
| TW | 200402809 A | 2/2004 |
| TW | 201532280 A | 8/2015 |

* cited by examiner

STRUCTURE AND FORMATION METHOD OF SEMICONDUCTOR DEVICE STRUCTURE

CROSS REFERENCE TO RELATED APPLICATIONS

This application is a divisional application of U.S. application Ser. No. 14/856,875, filed on Sep. 17, 2015, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
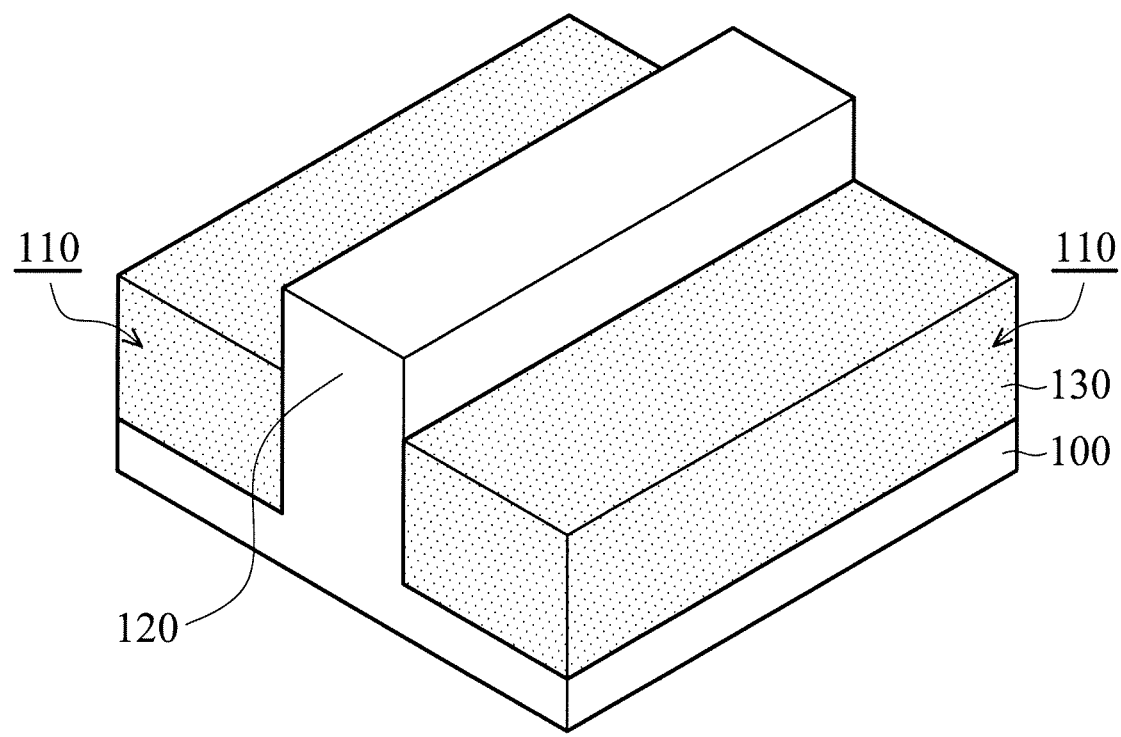
FIGS. 1A-1I are perspective views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1I are perspective views of various stages of a process for forming a semiconductor device structure, in accordance with some embodiments. Additional operations can be provided before, during, and/or after the stages described in FIGS. 1A-1I. FIGS. 2A-2I are cross-sectional views of various stages of a process for forming a semiconductor device, in accordance with some embodiments. In some embodiments, FIGS. 2A-2I are cross-sectional views each respectively showing a portion of the structures shown in FIGS. 1A-1I. Some of the stages that are described can be replaced or eliminated for different embodiments. Additional features can be added to the semiconductor device structure. Some of the features described below can be replaced or eliminated for different embodiments.

Figure 2A:
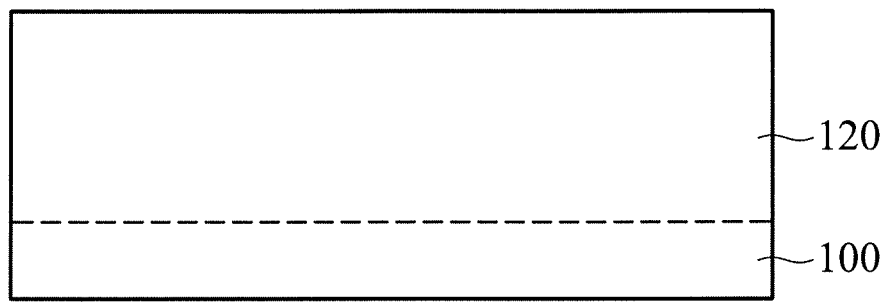
FIGS. 2A-2I are cross-sectional views of various stages of a process for forming a semiconductor device structure, in accordance with some embodiments.

As shown in FIGS. 1A and 2A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

As shown in FIG. 1A, multiple recesses (or trenches) 110 are formed in the semiconductor substrate 100, in accordance with some embodiments. As a result, multiple fin structures 120 are formed between the recesses 110. As shown in FIG. 1A, one of the fin structures 120 is shown. In some embodiments, one or more photolithography and etching processes are used to form the recesses 110.

As shown in FIG. 1A, isolation features 130 are formed in the recesses 110 to surround lower portions of the fin structures 120, in accordance with some embodiments. The isolation features 130 are used to define and electrically isolate various device elements formed in and/or over the semiconductor substrate 100. In some embodiments, the isolation features 130 include shallow trench isolation (STI) features, local oxidation of silicon (LOCOS) features, other suitable isolation features, or a combination thereof.

In some embodiments, each of the isolation features 130 has a multi-layer structure. In some embodiments, the isolation features 130 are made of a dielectric material. The dielectric material may include silicon oxide, silicon nitride, silicon oxynitride, spin-on glass low-K dielectric material, another suitable material, or a combination thereof. In some embodiments, an STI liner (not shown) is formed to reduce defects at the interface between the semiconductor substrate 100 and the isolation features 130. Similarly, the STI liner may also be used to reduce defects at the interface between the fin structures 120 and the isolation features 130.

In some embodiments, a dielectric material layer is deposited over the semiconductor substrate 100. The dielectric material layer covers the fin structures 120 and fills the recesses 110 between the fin structures 120. In some embodiments, the dielectric material layer is deposited using a chemical vapor deposition (CVD) process, a spin-on process, another applicable process, or a combination thereof. In some embodiments, a planarization process is performed to thin down the dielectric material layer until the top surfaces of the fin structures 120 are exposed. The planarization process may include a chemical mechanical polishing (CMP) process, a grinding process, an etching process, another applicable process, or a combination thereof. Afterwards, the dielectric material layer is etched back to form the isolation features 130. The fin structures 120 protrude from the isolation features 130, as shown in FIG. 1A in accordance with some embodiments.

Figure 1B:
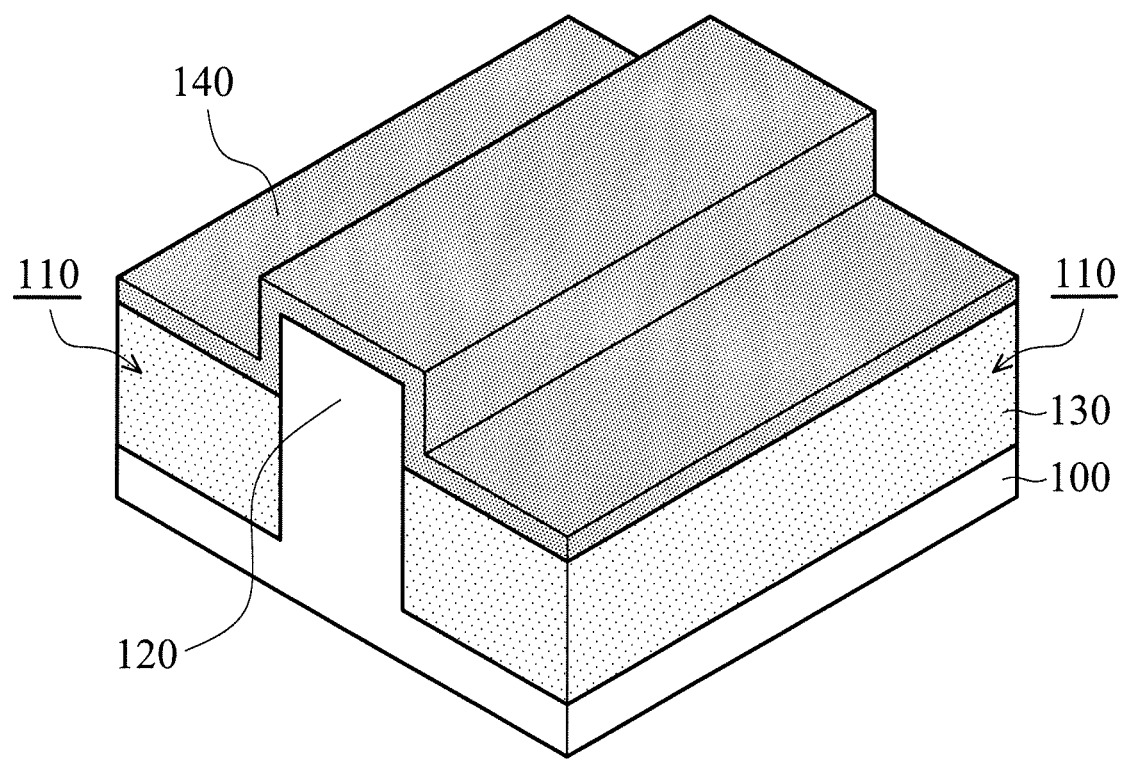
Figure 2B:
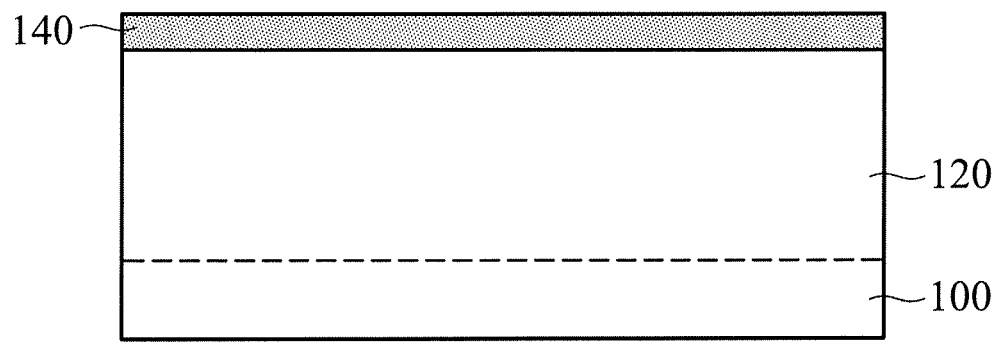

As shown in FIGS. 1B and 2B, a dielectric layer 140 is deposited over the semiconductor substrate 100, in accordance with some embodiments. The dielectric layer 140 covers the fin structures 120 and the isolation features 130. In some embodiments, the dielectric layer 140 extends over the fin structures 120 and the isolation features 130 conformally.

In some embodiments, the dielectric layer 140 is made of a high-K dielectric material. Examples of high-K dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the dielectric layer 140 is made of a dielectric material with a dielectric constant in a range from about 12 to about 50. In some embodiments, one or more portions of the dielectric layer 140 are dummy gate dielectric layers which will be removed in a subsequent process.

In some embodiments, the dielectric layer 140 is deposited using a CVD process, an atomic layer deposition (ALD) process, a thermal oxidation process, a physical vapor deposition (PVD) process, another applicable process, or a combination thereof.

Figure 1C:
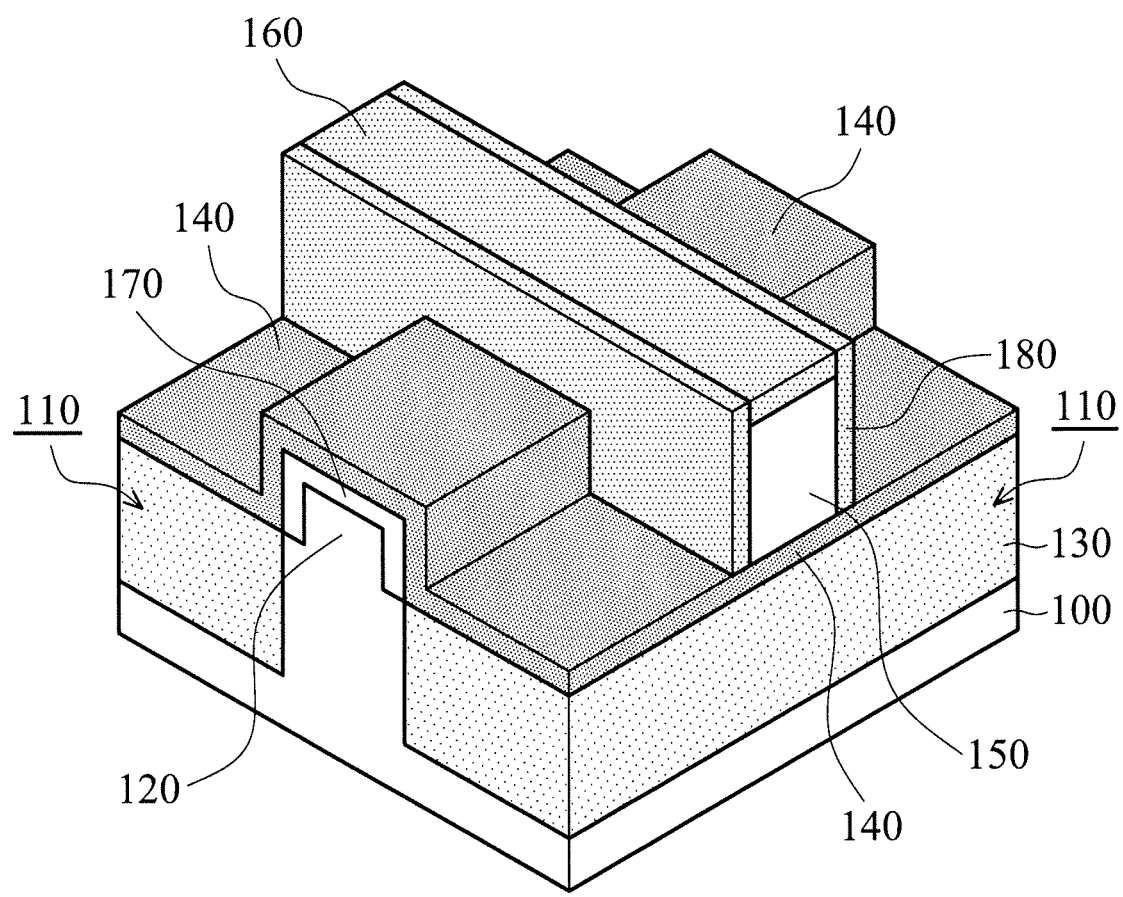
Figure 2C:
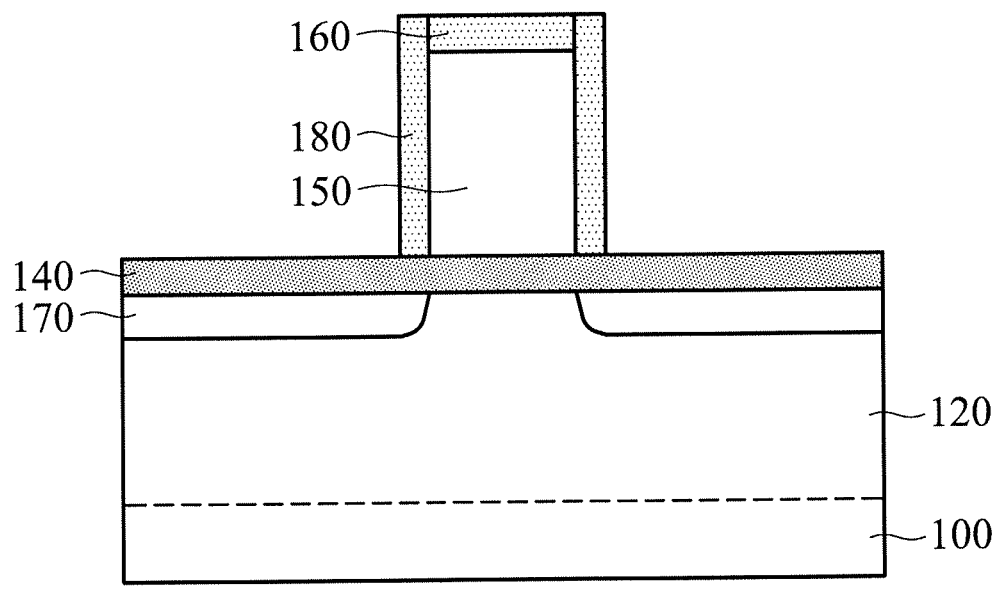

As shown in FIGS. 1C and 2C, a gate electrode 150 and a hard mask 160 are formed over the dielectric layer 140, in accordance with some embodiments. In some embodiments, the gate electrode 150 includes polysilicon, a metal material, another suitable conductive material, or a combination thereof. In some embodiments, the gate electrode 150 is a dummy gate electrode layer and will be replaced with another conductive material such as a metal material. The dummy gate electrode layer is made of, for example, polysilicon.

In some embodiments, the hard mask 160 is over the gate electrode 150. The hard mask 160 may be used to assist in the patterning process for forming the gate electrode 150. In some embodiments, the hard mask 160 is made of silicon oxide, silicon nitride, silicon oxynitride, silicon carbide, another suitable material, or a combination thereof. In some embodiments, the hard mask 160 has a multi-layer structure.

In some embodiments, a gate electrode layer and a hard mask layer are deposited over the dielectric layer 140. In some embodiments, the gate electrode layer, and the hard mask layer are sequentially deposited by using suitable deposition methods. The suitable deposition methods may include a CVD process, an ALD process, a thermal oxidation process, a PVD process, another applicable process, or a combination thereof. Afterwards, a photolithography process and an etching process are performed to pattern the hard mask layer to form the hard mask 160. With the assistance of the hard mask 160, the gate electrode layer is patterned. As a result, the gate electrode 150 is formed.

In some embodiments, the gate electrode 150 and the dielectric layer 140 covered by the gate electrode 150 together form a gate stack. In some embodiments, the gate stack is a dummy gate stack and will be replaced with a metal gate stack. In some embodiments, the gate stack surrounds side surfaces and a top surface of one or more of the fin structures 120 and further extends over the semiconductor substrate 100.

As shown in FIGS. 1C and 2C, lightly doped regions 170 are formed in the fin structures 120, in accordance with some embodiments. The lightly doped regions 170 are positioned at each side of the gate electrode 150, respectively. The lightly doped regions 170 serve as lightly doped source or drain (LDS/D) regions of the semiconductor device. Short channel effects may be mitigated by the lightly doped regions 170. In some embodiments, the lightly doped regions 170 are P-type. In some embodiments, the lightly doped regions 170 are N-type.

In some embodiments, the lightly doped regions 170 extend from the side surfaces and the top surface of the fin structures 120, without being surrounded by the isolation features 130, towards the inner of the fin structures 120, as shown in FIG. 1C. In some embodiments, the lightly doped regions 170 are surrounded by the dielectric layer 140. In some embodiments, the lightly doped regions 170 are in direct contact with the dielectric layer 140.

In some embodiments, a margin of the lightly doped regions 170 is substantially aligned with the sidewalls of the gate electrode 150 and the hard mask 160, as shown in FIG. 2C. In some other embodiments, the lightly doped regions 170 extend below the gate electrode 150.

In some embodiments, a light ion implantation process is performed to form the lightly doped regions 170. In some embodiments, an annealing process is subsequently performed to activate implanted dopants and reduce dopant diffusion in the lightly doped regions 170. In some embodiments, the annealing process is a rapid thermal annealing (RTA) process. In some embodiments, the gate electrode 150 and the hard mask 160 are used as an implantation mask to assist in the formation of the lightly doped regions 170. In some other embodiments, another implantation mask layer (not shown) is used to assist in the formation of the lightly doped regions 170.

Many variations and/or modifications can be made to embodiments of the disclosure. In some other embodiments, the lightly doped regions 170 are not formed.

As shown in FIGS. 1C and 2C, spacer elements 180 are formed over sidewalls of the gate electrode 150 and the hard mask 160, in accordance with some embodiments. In some embodiments, the lightly doped regions 170 are partially covered by the spacer elements 180. The spacer elements 180 may be used to assist in the formation of source and drain structures (or regions) in subsequent processes.

In some embodiments, the spacer elements 180 are made of silicon nitride, silicon oxynitride, silicon carbide, another suitable material, or a combination thereof. In some embodiments, a spacer layer is deposited over the dielectric layer 140. The spacer layer may be deposited using a CVD process, a PVD process, a spin-on process, another applicable process, or a combination thereof. Afterwards, an etching process, such as an anisotropic etching process, is performed to partially remove the spacer layer. As a result, the remaining portions of the spacer layer over the sidewalls of the gate electrode 150 and the hard mask 160 form the spacer elements 180.

Many variations and/or modifications can be made to embodiments of the disclosure. In some embodiments, the lightly doped regions 170 are formed after the formation of the spacer elements 180. In some embodiments, the margin of the lightly doped regions 170 is substantially aligned with an outer boundary of the spacer elements 180. Afterwards, a diffusion process is performed so that dopants in the lightly doped regions 170 are laterally driven towards the gate electrode 150. As a result, the lightly doped regions 170 expand and extend below the spacer elements 180. In some embodiments, the diffusion process is an annealing process, such as a rapid thermal annealing (RTA) process.

Figure 1D:
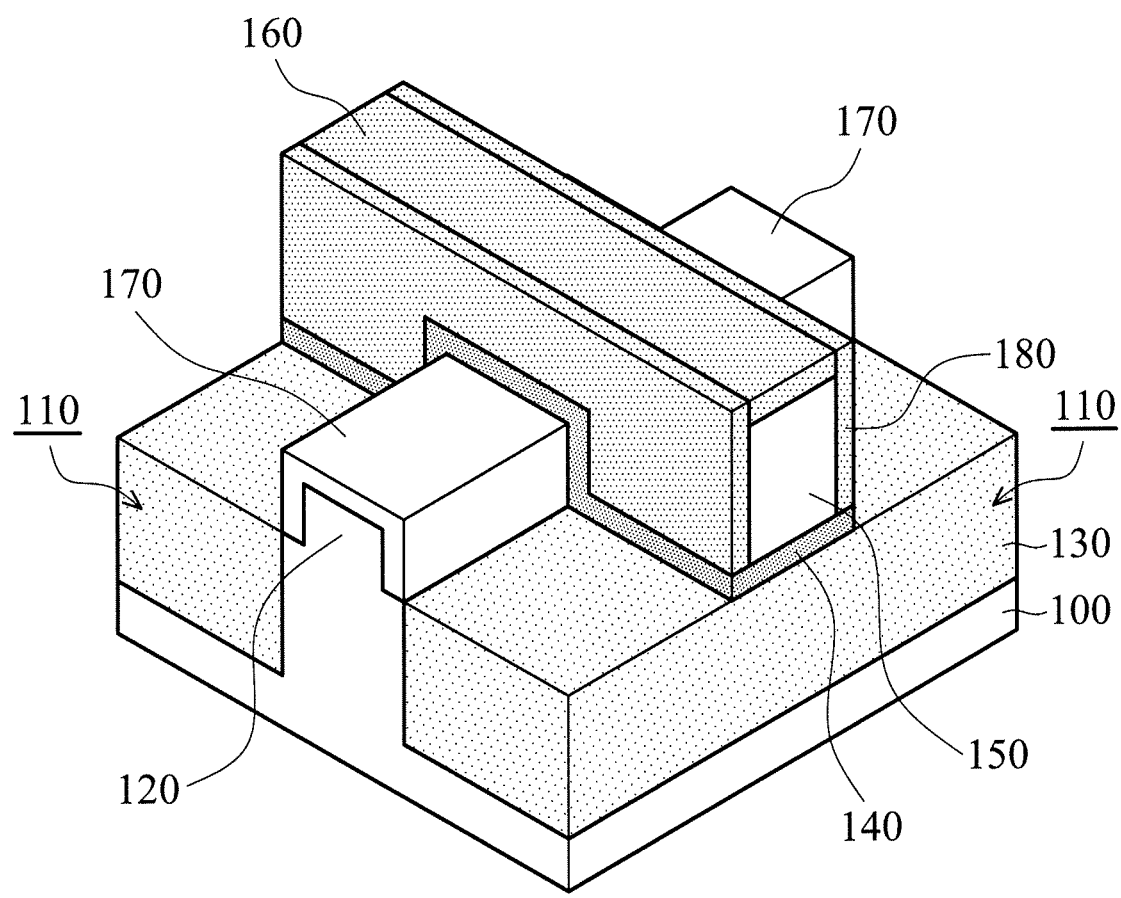
Figure 2D:
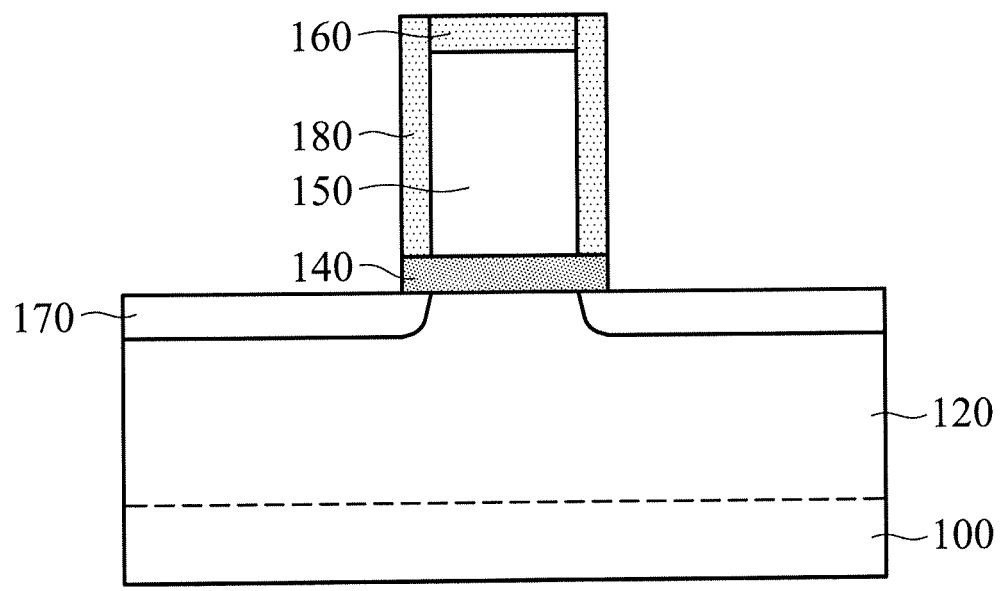

As shown in FIGS. 1D and 2D, one or more portions of the dielectric layer 140 are removed, in accordance with some embodiments. As a result, the lightly doped regions 170 and the isolation features 130 are partially exposed. Some portions of the dielectric layer 140, which are below the gate electrode 150, the hard mask 160 and the spacer elements 180, remain over the semiconductor substrate 100. In some embodiments, the sidewalls of the dielectric layer 140 that remains are substantially coplanar with the outer sidewalls of the spacer elements 180.

In some embodiments, an etching process is used to remove one or more portions of the dielectric layer 140. In some embodiments, the etching process includes a dry etching process, a wet etching process or another suitable etching process. In some other embodiments, the gate electrode 150, the hard mask 160 and the spacer elements 180 are used as an etching mask during the partial removal of the dielectric layer 140. In some other embodiments, another hard mask (not shown) is used to assist in the partial removal of the dielectric layer 140.

Embodiments of the disclosure are not limited thereto. In some embodiments, the lightly doped regions 170 are formed in the fin structures 120 after the partial removal of the dielectric layer 140. Afterwards, a diffusion process is performed so that the lightly doped regions 170 expand and extend below the spacer elements 180.

Figure 1E:
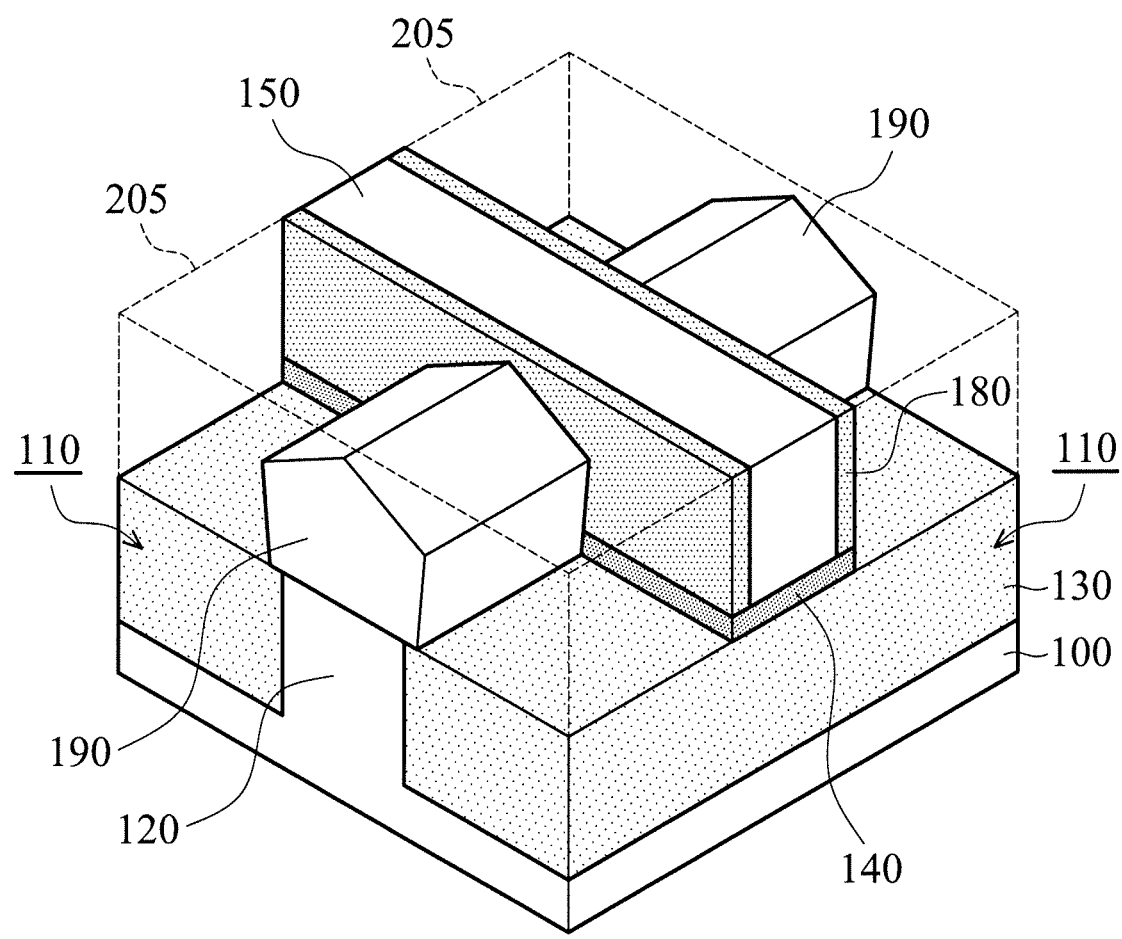
Figure 2E:
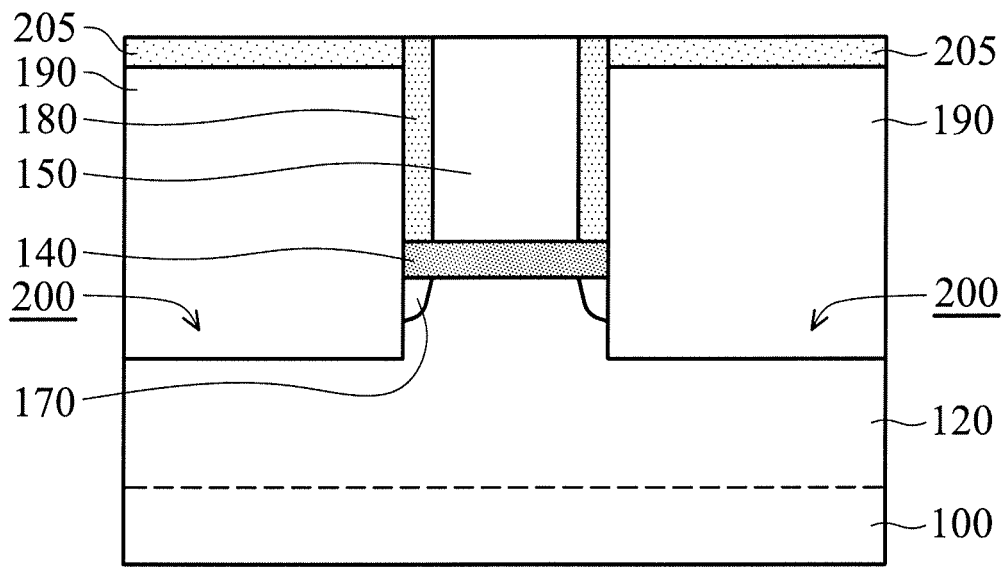

As shown in FIGS. 1E and 2E, source or drain structures 190 are formed over the fin structures 120, in accordance with some embodiments. In some embodiments, the source or drain structures 190 adjoin the lightly doped regions 170, the dielectric layer 140 and the spacer elements 180. The source or drain structures 190 may be used to provide stress or strain to channel regions below the gate electrode 150. As a result, the carrier mobility of the device and device performance are improved.

In some embodiments, some portions of the fin structures 120 that are not covered by the dielectric layer 140 are recessed to be lower than the dielectric layer 140. In some other embodiments, some portions of the fin structures 120 are recessed to be lower than the top surface of the isolation features 130. In some embodiments, an etching process is performed to remove the upper portions of the fin structures 120. As a result, recesses 200 are formed in the fin structures 120, as shown in FIG. 2E. In some other embodiments, multiple etching operations are used so that the recesses 200 further extend laterally towards the channel regions below the gate electrode 150. It should be noted that embodiments of the disclosure have many variations. In some other embodiments, the fin structures 120 are not partially removed to form the recesses 200.

Some portions of the lightly doped regions 170 are removed to form the recesses 200, as shown in FIG. 2E in accordance with some embodiments. In some embodiments, some portions of the lightly doped regions 170 that are not covered by the dielectric layer 140 are removed. In some embodiments, the remaining portion of the lightly doped regions 170 is exposed from the recesses 200. In some embodiments, the fin structures 120 are recessed to a level below the bottom of the lightly doped regions 170.

In some embodiments, a semiconductor material (or two or more semiconductor materials) is epitaxially grown over the fin structures 120 that are recessed, and is growing continually to above the recesses 200 so as to form the source or drain structures 190. In some embodiments, the growth of the source or drain structures 190 is performed simultaneously. In some embodiments, the growth of some of the source or drain structures 190 is performed separately in different processes.

In some embodiments, the source or drain structures 190 are a P-type semiconductor material. For example, the source or drain structures 190 may include epitaxially grown silicon or epitaxially grown silicon germanium. The source or drain structures 190 are not limited to being a P-type semiconductor material. In some embodiments, the source or drain structures 190 are an N-type semiconductor material. The source or drain structures 190 may include epitaxially grown silicon, silicon-germanium (SiGe), epitaxially grown phosphorous-doped silicon (SiP), boron-dopde silicon germanium (SiGeB) or another suitable epitaxially grown semiconductor material.

In some embodiments, the source or drain structures 190 are formed using a selective epitaxy growth (SEG) process, a CVD process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g. Si, Ge or SiGe) followed by a solid-phase epitaxial recrystallization (SPER) step, another applicable process, or a combination thereof. The formation process of the source or drain structures 190 may use gaseous and/or liquid precursors. In some embodiments, the source or drain structures 190 are grown in-situ in the same process chamber. In other words, the source or drain structures 190 are formed using an in-situ epitaxial growth process. In some other embodiments, some of the source or drain structures 190 are grown separately.

In some embodiments, the source or drain structures 190 are doped with one or more suitable dopants. For example, the source or drain structures 190 are Si source or drain features doped with phosphorus (P), arsenic (As), or another suitable dopant. Alternatively, the source or drain structures 190 are SiGe source or drain features doped with boron (B) or another suitable dopant. In some embodiments, multiple implantation processes are performed to dope the source or drain structures 190. In some embodiments, the spacer elements 180, which are formed over the sidewalls of the gate electrode 150 and the hard mask 160, assists in the formation of the source or drain structures 190.

In some embodiments, the source or drain structures 190 are doped in-situ during the growth of the source or drain structures 190. In some other embodiments, the source or drain structures 190 are not doped during the growth of the source or drain structures 190. After the epitaxial growth, the source or drain structures 190 are doped in a subsequent process. In some embodiments, the doping is achieved using an ion implantation process, a plasma immersion ion implantation process, a gas and/or solid source diffusion process, another applicable process, or a combination thereof. In some embodiments, the source or drain structures 190 are further exposed to annealing processes to activate the dopants. For example, a rapid thermal annealing process is performed.

As shown in FIGS. 1E and 2E, a dielectric layer 205 is deposited over the isolation features 130, the source or drain structures 190 and the gate electrode 150. In some embodiments, the source or drain structures 190 are surrounded by the dielectric layer 205. In some embodiments, the dielectric layer 205 is made of silicon oxide, silicon oxynitride, borosilicate glass (BSG), phosphosilicate glass (PSG), borophosphosilicate glass (BPSG), fluorinated silicate glass (FSG), low-K material, porous dielectric material, another suitable dielectric material, or a combination thereof. In some embodiments, the dielectric layer 205 is deposited using a CVD process, a spin-on process, an ALD process, a PVD process, another applicable process, or a combination thereof.

Afterwards, the dielectric layer 205 is thinned down until the gate electrode 150 is exposed. In some embodiments, a planarization process is performed to thin down the dielectric layer 205. The planarization process may include a CMP process, a grinding process, an etching process, another applicable process, or a combination thereof. In some embodiments, the dielectric layer 205 is deposited over the hard mask 160 and the spacer elements 180. The hard mask 160 and the upper portions of the spacer elements 180 are removed during the planarization process for thinning down the dielectric layer 205.

Embodiments of the disclosure are not limited thereto. In some other embodiments, the dielectric layer 205 is thinned down until the hard mask 160 is exposed. Afterwards, the hard mask 160 and the upper portions of the spacer elements 180 are removed to expose the gate electrode 150. In some embodiments, an etching process is used to remove the hard mask 160 and the upper portions of the spacer elements 180. In some embodiments, the etching process includes a dry etching process, a wet etching process or another suitable etching process.

Many variations and/or modifications can be made to embodiments of the disclosure. In some other embodiments, the hard mask 160 and the upper portions of the spacer elements 180 are removed using an etching process before the formation of the dielectric layer 205. In some other embodiments, the hard mask 160 and the upper portions of the spacer elements 180 are removed using an etching process, and the dielectric layer 205 is not formed. In some embodiments, the etching process includes a dry etching process, a wet etching process or another suitable etching process.

Figure 1F:
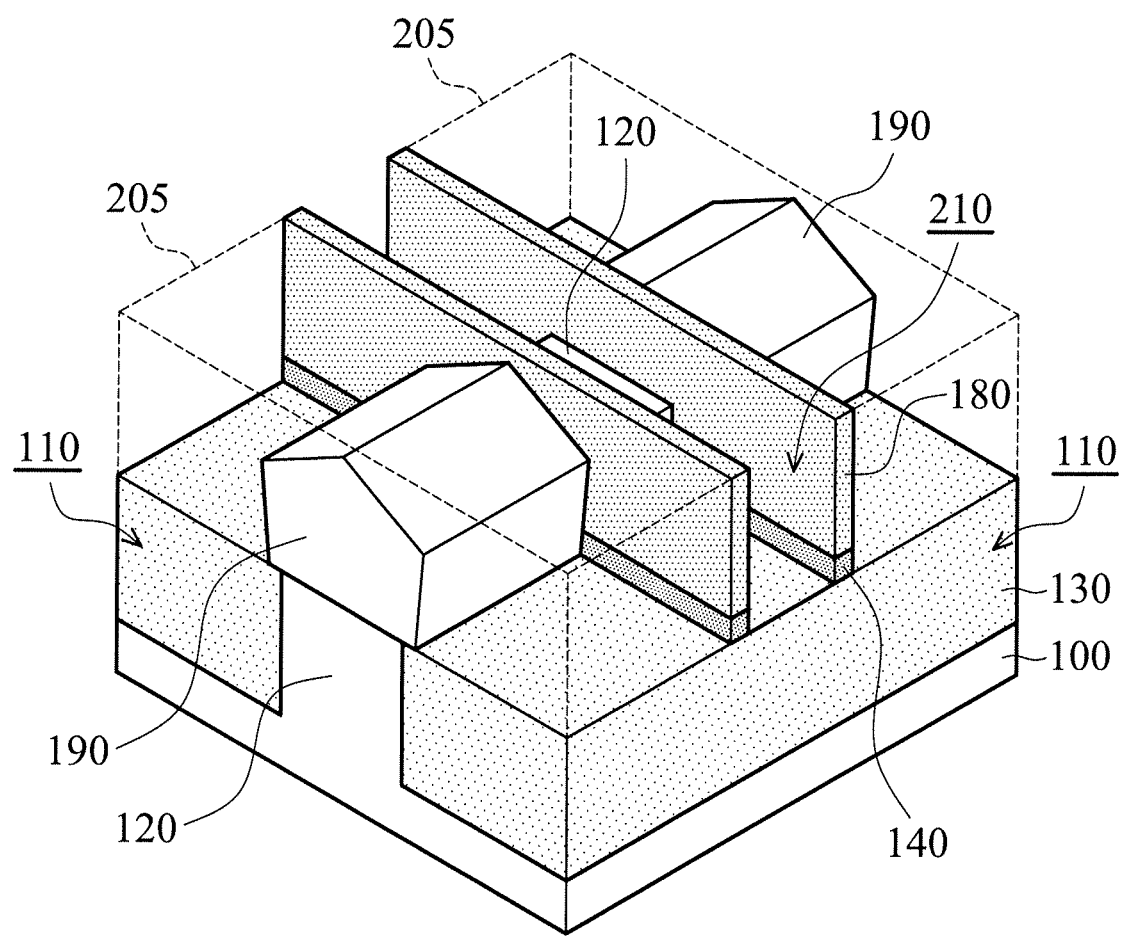
Figure 2F:
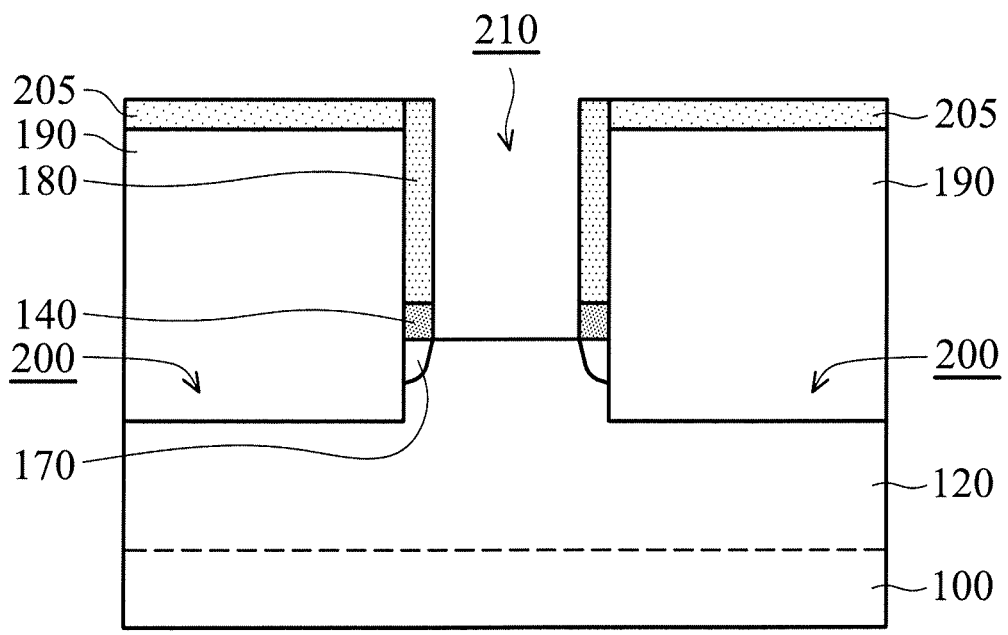

A dummy gate stack including the gate electrode 150 and the dielectric layer 140 below the gate electrode 150 is removed, as shown in FIGS. 1F and 2F in accordance with some embodiments. As a result, a trench 210 is formed over the semiconductor substrate 100. In some embodiments, the trench 210 exposes portions of the fin structures 120 and the isolation features 130 that are previously covered by the gate electrode 150 and the dielectric layer 140. The exposed portions of the fin structures 120 may serve as channel regions. In some embodiments, the dummy gate stack is removed using a wet etching process, a dry etching process, another applicable process, or a combination thereof.

Figure 1G:
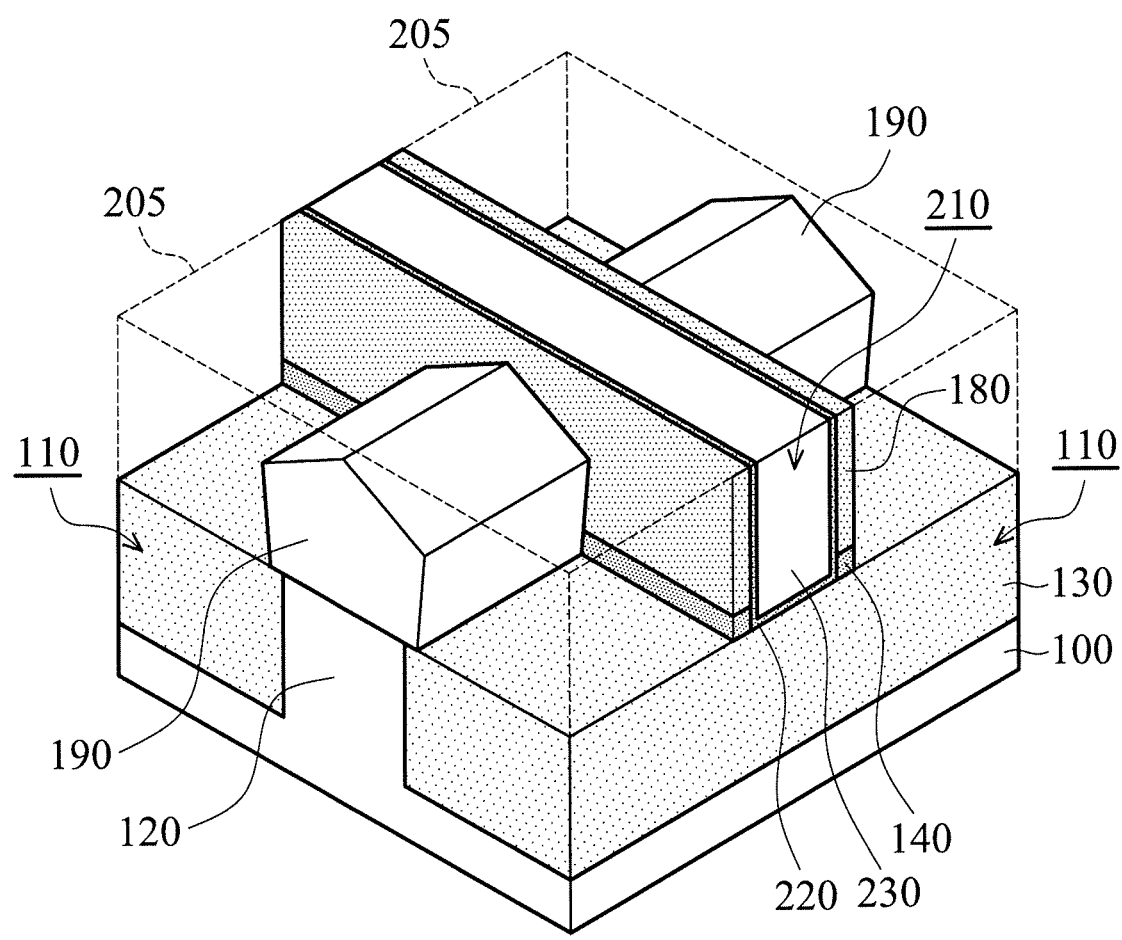
Figure 2G:
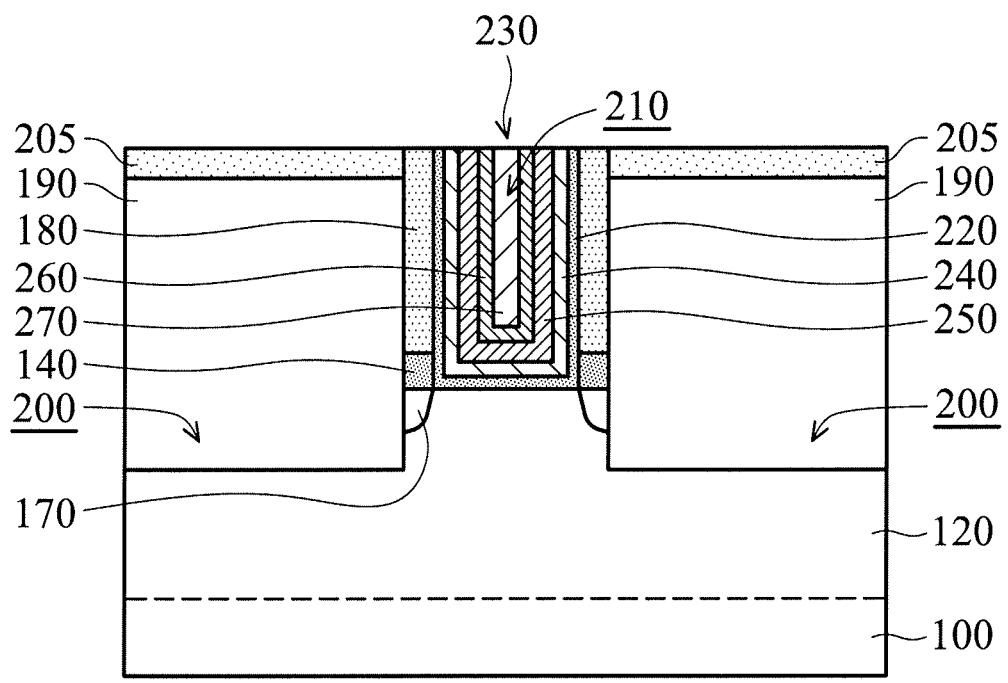

As shown in FIGS. 1G and 2G, a gate dielectric layer 220 is deposited over the sidewalls and the bottom of the trench 210, in accordance with some embodiments. In some embodiments, the gate dielectric layer 220 extends over the fin structures 120 conformally. In some embodiments, the gate dielectric layer 220 extends over the dielectric layer 205. In some embodiments, the gate dielectric layer 220 is a high-K dielectric layer. The high-K dielectric layer may be made of hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 220 is made of a dielectric material with a dielectric constant in a range from about 12 to about 50.

In some embodiments, the gate dielectric layer 220 is deposited using an ALD process, a CVD process, a spin-on process, another applicable process, or a combination thereof. In some embodiments, a high-temperature annealing operation is performed to reduce or eliminate defects in the gate dielectric layer 220.

In some other embodiments, before the gate dielectric layer 220 is formed, an interfacial layer (not shown) is formed in the trench 210. The interfacial layer may be used to reduce stress between the gate dielectric layer 220 and the fin structures 120. In some embodiments, the interfacial layer is made of silicon oxide. In some embodiments, the interfacial layer is formed using an ALD process, a thermal oxidation process, another applicable process, or a combination thereof.

As shown in FIGS. 1G and 2G, a metal gate stack structure 230 is formed in the trench 210, in accordance with some embodiments. In some embodiments, metal gate stacking layers are deposited over the gate dielectric layer 220. In some embodiments, the metal gate stacking layers include a barrier layer 240, a work function layer 250, a blocking layer 260, and a metal filling layer 270. Some of these metal gate stacking layers can be replaced or eliminated for different embodiments. Additional layers can be added to form the metal gate stacking layers.

As shown in FIG. 2G, the barrier layer 240 is deposited over the gate dielectric layer 220, in accordance with some embodiments. The barrier layer 240 may be used to interface the gate dielectric layer 220 with the subsequently formed work function layer 250. The barrier layer 240 may also be used to prevent diffusion between the gate dielectric layer 220 and the subsequently formed work function layer 250. In some embodiments, the barrier layer 240 conformally extends over the sidewalls and the bottom of the trench 210.

In some embodiments, the barrier layer 240 is made of a metal-containing material. The metallic material may include titanium nitride, tantalum nitride, another suitable material, or a combination thereof. In some embodiments, the barrier layer 240 includes multiple layers. In some embodiments, the barrier layer 240 is deposited using an ALD process, a PVD process, an electroplating process, an electroless plating process, a CVD process, another applicable process, or a combination thereof. In some other embodiments, the barrier layer 240 is not formed.

As shown in FIG. 2G, the work function layer 250 is formed over the barrier layer 240, in accordance with some embodiments. The work function layer 250 is used to provide the desired work function for transistors to enhance device performance including improved threshold voltage. In some embodiments, the work function layer 250 conformally extends over the sidewalls and the bottom of the trench 210.

In the embodiments of forming an NMOS transistor, the work function layer 250 can be an N-type metal layer. The N-type metal layer may include metal, metal carbide, metal nitride, or a combination thereof. For example, the N-type metal layer includes titanium nitride, tantalum, tantalum nitride, another suitable material, or a combination thereof.

On the other hand, in the embodiments of forming a PMOS transistor, the work function layer 250 can be a P-type metal layer. The P-type metal layer may include metal, metal carbide, metal nitride, other suitable materials, or a combination thereof. For example, the P-type metal includes tantalum nitride, tungsten nitride, titanium, titanium nitride, other suitable materials, or a combination thereof.

The work function layer 250 may also be made of hafnium, zirconium, titanium, tantalum, aluminum, metal carbides (e.g., hafnium carbide, zirconium carbide, titanium carbide, aluminum carbide), metal nitrides, ruthenium, palladium, platinum, cobalt, nickel, conductive metal oxides, or a combinations thereof. The thickness and/or the compositions of the work function layer 250 may be fine-tuned to adjust the work function level. For example, a titanium nitride layer may be used as a P-type metal layer or an N-type metal layer, depending on the thickness and/or the compositions of the titanium nitride layer.

As shown in FIG. 2G, the blocking layer 260 is deposited over the work function layer 250, in accordance with some embodiments. The blocking layer 260 may be used to prevent the subsequently formed metal filling layer 270 from diffusing or penetrating into the work function layer 250. In some embodiments, the blocking layer 260 conformally extends over the sidewalls and the bottom of the trench 210.

In some embodiments, the blocking layer 260 is made of tantalum nitride, titanium nitride, another suitable material, or a combination thereof. In some embodiments, the blocking layer 260 is deposited using an ALD process, a PVD process, an electroplating process, an electroless plating process, another applicable process, or a combination thereof. In some other embodiments, the blocking layer 260 is not formed.

As shown in FIG. 2G, the metal filling layer 270 is deposited over the blocking layer 260 to fill the trench 210, in accordance with some embodiments. In some embodiments, the metal filling layer 270 is made of tungsten, aluminum, copper, cobalt, another suitable material, or a combination thereof. In some embodiments, the metal filling layer 270 is deposited using a PVD process, a CVD process, an electroplating process, an electroless plating process, another applicable process, or a combination thereof. In some other embodiments, the metal filling layer 270 is not formed.

In some embodiments, the gate dielectric layer 220 and the metal gate stacking layers together fill the trench 210. In some embodiments, the portions of the gate dielectric layer 220 and the metal gate stacking layers outside of the trench 210 cover the dielectric layer 205. Afterwards, the portions of the gate dielectric layer 220 and the metal gate stacking layers outside of the trench 210 are removed. As a result, the metal gate stacking layers remaining in the trench 210 together form the metal gate stack structure 230. The metal gate stack structure 230 and the gate dielectric layer 220 remaining in the trench 210 together form a gate stack. For example, a planarization process is used to partially remove the gate dielectric layer 220 and the metal gate stacking layers outside of the trench 210. The planarization process may include a CMP process, a grinding process, an etching process, another applicable process, or a combination thereof.

Embodiments of the disclosure are not limited thereto. In some other embodiments, the portions of the gate dielectric layer 220, the metal gate stack structure 230, and the dielectric layer 205 over the source or drain structures 190 are removed. As a result, the top surfaces of the source or drain structures 190 are exposed. For example, a planarization process is used to partially remove the gate dielectric layer 220, the metal gate stack structure 230, and the dielectric layer 205. The planarization process may include a CMP process, a grinding process, an etching process, another applicable process, or a combination thereof.

Figure 1H:
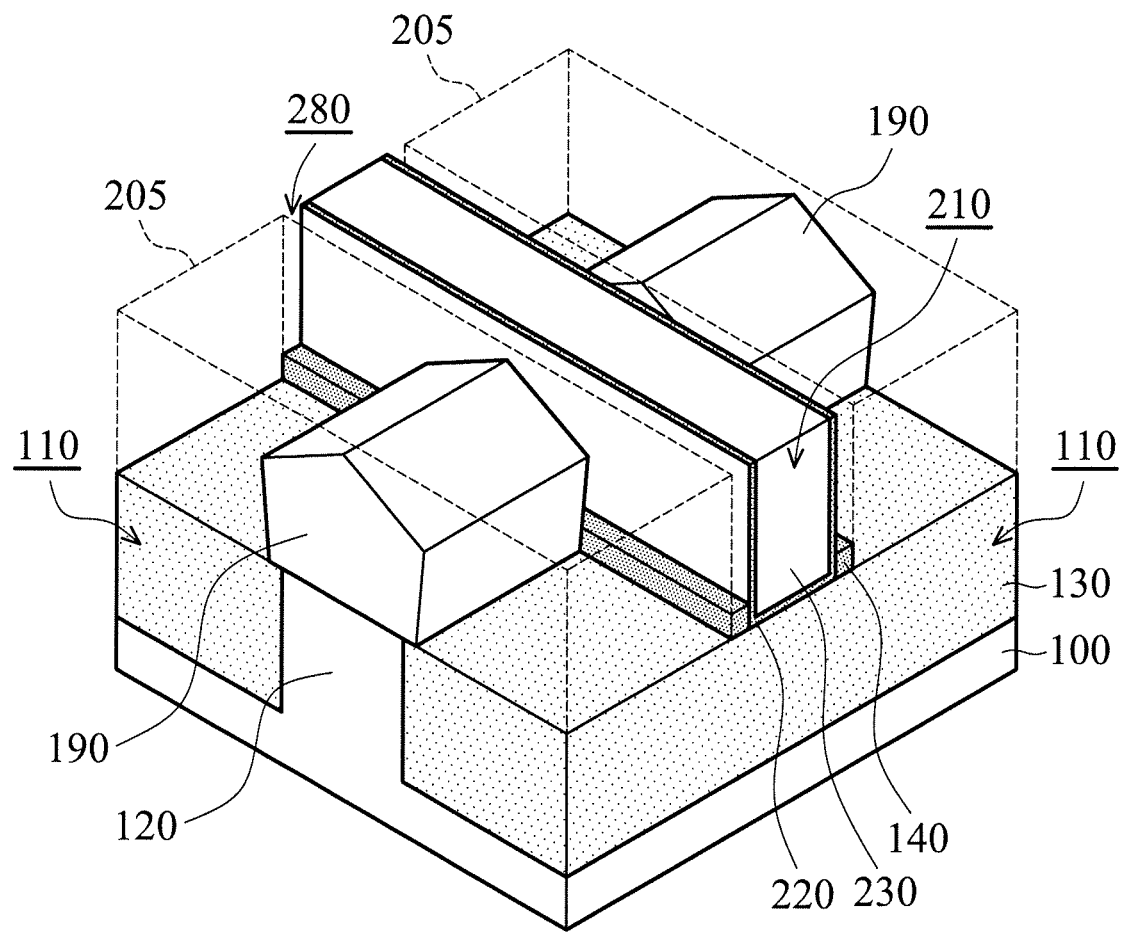
Figure 2H:
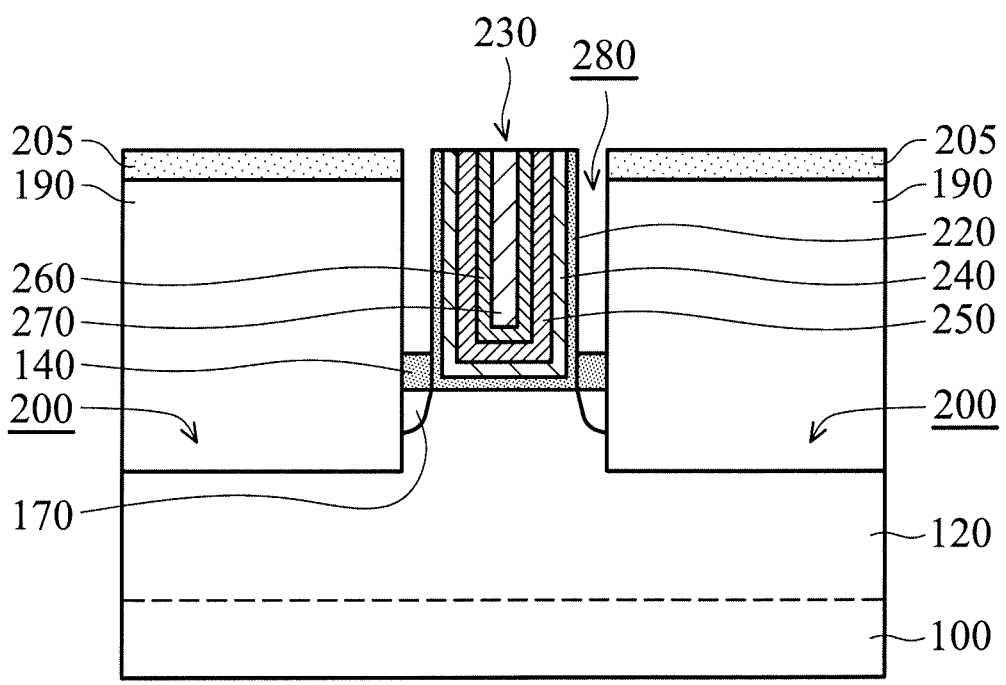

As shown in FIGS. 1H and 2H, the spacer elements 180 are removed, in accordance with some embodiments. As a result, recesses 280 are formed between the gate dielectric layer 220 and the source or drain structures 190 and between the gate dielectric layer 220 and the dielectric layer 205. The top surfaces of the dielectric layer 140 are exposed from the recesses 280. In some embodiments, an etching process is used to remove the spacer elements 180. In some embodiments, the etching process includes a wet etching process, a dry etching process, or another suitable etching process. In some embodiments, the etchant used in the etching process includes a liquid mixture. The liquid mixture may include $H_3PO_4$, another suitable solution, or a combination thereof. In some other embodiments, the etchant used in the etching process includes a gas mixture. The gas mixture may include $Cl_2$, $HBr$, $BCl_3$, $NF_3$, $N_2$, $CF_4$, $CH_2F_2$, $N_2$, $O_2$, $Ar$, $N_2H_2$, $SF_6$, $SiCl_4$, $CH_4$, another suitable gas, or a combination thereof.

Figure 1I:
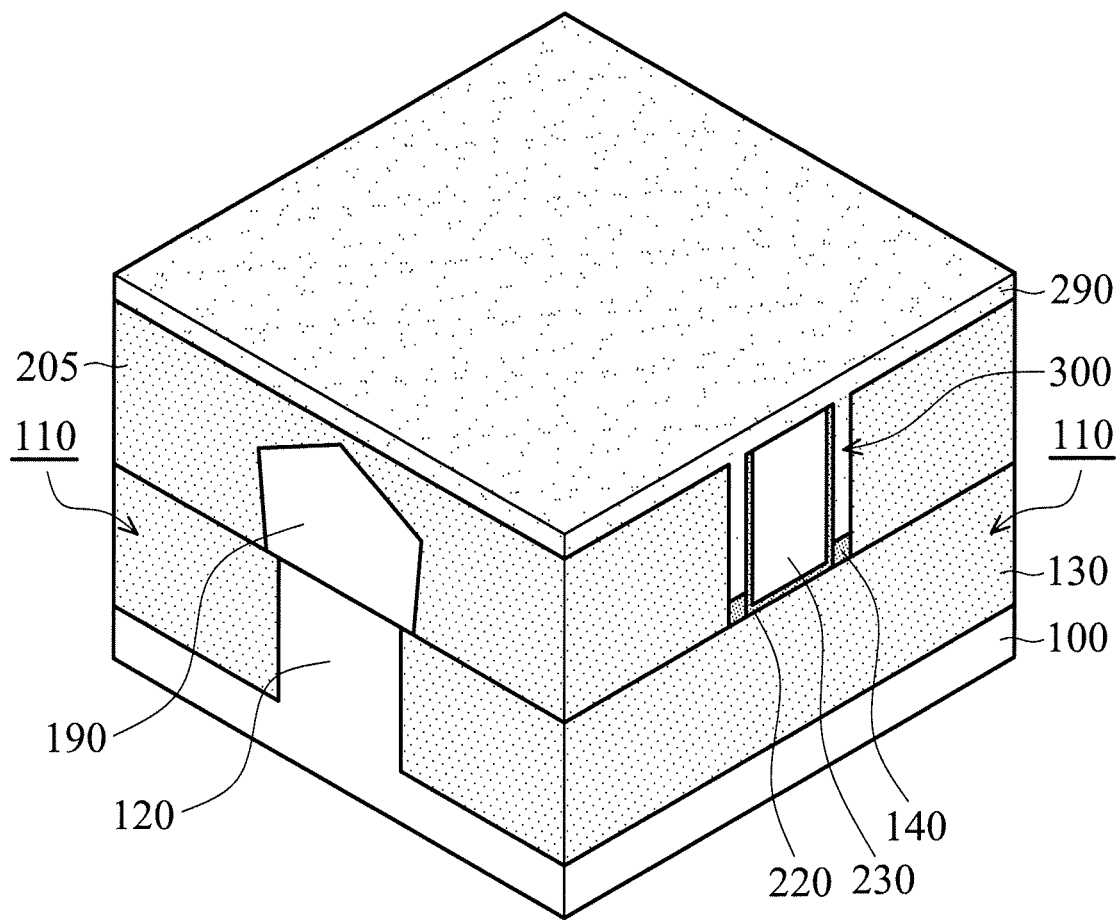
Figure 2I:
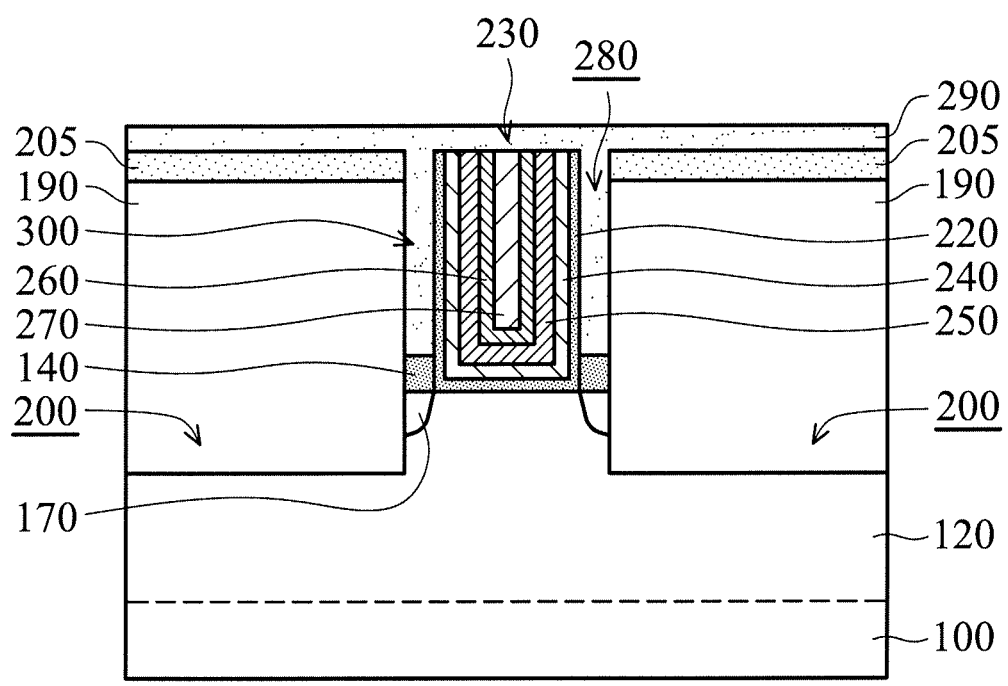

As shown in FIGS. 1I and 2I, a dielectric layer 290 is deposited over the semiconductor substrate 100 and fills the recesses 280, in accordance with some embodiments. In some embodiments, the dielectric layer 290 covers the fin structures 120, the source or drain structures 190, and the metal gate stack structure 230. In some embodiments, the dielectric layer 290 is in direct contact with the dielectric layer 140 below the recesses 280. In some embodiments, the dielectric layer 290 extends over the isolation features 130 and the dielectric layer 205. In some other embodiments, the dielectric layer 290 is in direct contact with the top surfaces of the source or drain structures 190.

In some embodiments, the dielectric layer 290 is made of a low-K dielectric material. Examples of low-K dielectric materials include silicon oxide, BSG, PSG, BPSG, FSG, $SiO_xC_y$, Spin-On-Glass, Spin-On-Polymers, silicon carbon material, carbon doped oxides, porous carbon doped silicon dioxide, another suitable low-K dielectric material, or a combination thereof. In some embodiments, the dielectric layer 290 is made of a dielectric material with a dielectric constant in a range from about 2 to about 4. In some embodiments, the dielectric layer 290 is deposited using a CVD process, an ALD process, a thermal oxidation process, a PVD process, another applicable process, or a combination thereof.

As shown in FIGS. 1G-1I and 2G-2I, the spacer elements 180 are replaced with the dielectric layer 290, in accordance with some embodiments. In some embodiments, the dielectric constant of the spacer elements 180 is greater than the dielectric constant of the dielectric layer 290. In some embodiments, the difference between the dielectric constants of the spacer elements 180 and the dielectric layer 290 is in a range from about 8 to about 48. In some embodiments, a ratio of the dielectric constant of the spacer elements 180 to the dielectric constant of the dielectric layer 290 is in a range from about 3 to about 10.

The dielectric layer 290 is designed to have a low dielectric constant so as to lower the capacitance between the metal gate stack structure 230 and the source or drain structures 190. Accordingly, gate-to-drain and gate-to-source capacitances are reduced due to the dielectric layer 290. Therefore, the parasitic capacitances of the semiconductor device structure are lowered. Consequently, the power consumption is greatly reduced and the semiconductor device structure can operate faster.

In some embodiments, the replacement of the spacer elements 180 by the dielectric layer 290 is performed after the formation of the source or drain structures 190 and the metal gate stack structure 230. Accordingly, damage to the dielectric layer 290 during the aforementioned processes can be avoidable. In some embodiments, the spacer elements 180 are used as sacrificial features. The sacrificial features may include a hard material so as to endure damage during the aforementioned processes. Embodiments of the disclosure are not limited thereto. The sequence of the replacement can be different from that described in FIGS. 1A-1I and 2A-2I for different embodiments.

Subsequently, various features will be formed over the semiconductor substrate 100. Some of the various features are electrically connected to the metal gate stack structure 230 and the source or drain structures 190. The various features may include contacts, interconnection layers, vias and another suitable feature. In some embodiments, the dielectric layer 290 over the metal gate stack structure 230 and the source or drain structures 190 is an interlayer dielectric layer. In some embodiments, the contacts are formed in the dielectric layer 290 over the metal gate stack structure 230 and the source or drain structures 190. In some other embodiments, another interlayer dielectric layer is formed over the semiconductor substrate 100.

As shown in FIGS. 1I and 2I, the dielectric layer 140 and the dielectric layer 290 together construct composite spacer elements 300 over the semiconductor substrate 100, in accordance with some embodiments. The spacer elements 300 are formed over the sidewalls of the gate stack. Each of the spacer elements 300 includes a first layer (i.e., the dielectric layer 140) and a second layer (i.e., the second layer 290) over the first layer 140. In some embodiments, the first layer 140 is thinner than the second layer 290. In some other embodiments, the thickness of the first layer 140 is the same as or greater than the thickness of the second layer 290.

In some embodiments, the dielectric constant of the first layer 140 is greater than the dielectric constant of the second layer 290. In some embodiments, the difference between the dielectric constants of the first layer 140 and the second layer 290 is in a range from about 8 to about 48. In some embodiments, a ratio of the dielectric constant of the first layer 140 to the dielectric constant of the second layer 290 is in a range from about 3 to about 10.

In some embodiments, the first layer 140 and the second layer 290 are between the source or drain structures 190 and the metal gate stack structure 230. In some embodiments, the first layer 140 and the second layer 290 are in direct contact with the source or drain structures 190. In some embodiments, the second layer 290 extends over the source or drain structures 190. In some embodiments, the second layer 290 extends over the gate dielectric layer 220 and the metal gate stack structure 230.

In some embodiments, the dielectric constant of the gate dielectric layer 220 is greater than the dielectric constant of the second layer 290. In some embodiments, the difference between the dielectric constants of the gate dielectric layer 220 and the second layer 290 is in a range from about 8 to about 48. In some embodiments, a ratio of the dielectric constant of the gate dielectric layer 220 to the dielectric constant of the second layer 290 is in a range from about 3 to about 10.

In some embodiments, the first layer 140 is sandwiched between the second layer 290 and the lightly doped regions 170. In some other embodiments, the first layer 140 is sandwiched between the second layer 290 and the fin structures 120. In some embodiments, the lightly doped regions 170 are separated from the second layer 290 by the first layer 140.

In accordance with some embodiments, the spacer elements 300 include the first layer 140 made of a high-K dielectric material and the second layer 290 made of a low-K dielectric material. The high-K dielectric material helps attract electrons more easily when the semiconductor device structure is turned on. Accordingly, the first layer 140 improves attraction of electrons and induces accumulation of electrons in the lightly doped regions 170. Due to the increase in the density of electrons, the resistance of the lightly doped regions 170 is reduced. In some other embodiments, some regions in the fin structures 120, which adjoin channel regions and the first layer 140, have a lowered resistance due to the first layer 140.

The first layer 140 also increases electrostatic coupling between the metal gate stack structure 230 and the lightly doped regions 170. The first layer 140 further mitigates or eliminates surface segregation of dopants and dopant deactivation issues caused by the dielectric mismatch between the lightly doped regions 170 and their surroundings. Therefore, the device characteristics of the semiconductor device structure are enhanced. In some embodiments, the device characteristics includes a subthreshold swing (SS) value, a drain-induced barrier lowering (DIBL) value, an ON/OFF current ratio, a charge carrier density, or other device characteristics.

In some cases, a spacer including a high-K dielectric material increases the gate-to-drain and gate-to-source capacitances. There is a tradeoff between reducing the resistance of a lightly doped region and increasing the parasitic resistances.

As mentioned above, because the spacer elements 300 include the second layer 290 made of a low-K dielectric material, the gate-to-drain and gate-to-source capacitances of the semiconductor device structure are reduced. In view of the foregoing, the spacer elements 300 are able to upgrade the device performance of the semiconductor device structure by the first layer 140 and compensate the increase in the parasitic capacitances by the second layer 290. Therefore, embodiments of the disclosure provide a better and tunable tradeoff between reducing the resistance of the lightly doped regions and increasing the parasitic resistances.

Embodiments of the disclosure can be applied to not only a semiconductor device structure with FinFETs but also a semiconductor device structure with planar FETs. In some embodiments, the materials and/or formation methods of a semiconductor device structure with planar FETs are similar to those of the described semiconductor device structure with FinFETs.

Embodiments of the disclosure form a semiconductor device structure with composite spacer elements over sidewalls of a gate stack. The composite spacer elements include a first layer and a second layer over the first layer. The dielectric constant of the first layer is greater than the dielectric constant of the second layer. As a result, the resistance of regions adjoining a channel region (such as the resistance of lightly doped regions) is significantly reduced due to the first layer. Furthermore, the parasitic capacitances of the semiconductor device structure are lowered due to the second layer. Therefore, the performance and reliability of the semiconductor device structure are greatly improved.

In accordance with some embodiments, a semiconductor device structure is provided. The semiconductor device structure includes a fin structure over a semiconductor substrate. The semiconductor device structure also includes a gate stack covering a portion of the fin structure. The semiconductor device structure further includes a spacer element over a sidewall of the gate stack. The spacer element includes a first layer and a second layer over the first layer. The dielectric constant of the first layer is greater than the dielectric constant of the second layer. A gate dielectric layer of the gate stack adjoins the first layer and the second layer.

In accordance with some embodiments, a semiconductor device structure is provided. The semiconductor device structure includes a fin structure over a semiconductor substrate. The semiconductor device structure also includes a gate stack covering a portion of the fin structure. The semiconductor device structure further includes a spacer element over a sidewall of the gate stack. The spacer element includes a first layer and a second layer. The dielectric constant of the first layer is greater than the dielectric constant of the second layer. In addition, the semiconductor device structure includes a source or drain structure over the semiconductor substrate. The second layer extends over a top surface of the source or drain structure.

In accordance with some embodiments, a semiconductor device structure is provided. The semiconductor device structure includes a gate stack covering a fin structure. The semiconductor device structure also includes a spacer element over a sidewall of the gate stack. The spacer element comprises a first layer and a second layer. The second layer is separated from the fin structure by the first layer. The semiconductor device structure further includes a source or drain structure over the fin structure. The gate stack and the source or drain structure sandwich the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a fin structure over a semiconductor substrate;
    a gate stack covering a portion of the fin structure; and
    a spacer element over a sidewall of the gate stack, wherein the spacer element comprises a first layer and a second layer over the first layer, the second layer is a single dielectric layer, and a dielectric constant of the first layer is greater than a dielectric constant of the second layer, and wherein the gate stack comprises a gate dielectric layer and a metal filling layer over and surrounded by the gate dielectric layer, a sidewall of the gate dielectric layer of the gate stack is in contact with the first layer and the second layer, and a bottom surface of the second layer is higher than a bottom surface of the gate dielectric layer;
    a source or drain structure over the semiconductor substrate, wherein the first layer and the second layer are between the source or drain structure and the gate stack; and
    a dielectric layer over the source or drain structure, wherein the second layer is in direct contact with a top surface of the dielectric layer and a top surface of the gate stack.

2. The semiconductor device structure as claimed in claim 1, wherein the first layer is sandwiched between the second layer and the fin structure.

3. The semiconductor device structure as claimed in claim 1, further comprising a lightly doped region in the fin structure, wherein the lightly doped region is in contact with the first layer.

4. The semiconductor device structure as claimed in claim 1, wherein the second layer extends over the gate stack.

5. The semiconductor device structure as claimed in claim 1, wherein a first contact area between the first layer and the sidewall of the gate dielectric layer is less than a second contact area between the second layer and the sidewall of the gate dielectric layer.

6. The semiconductor device structure as claimed in claim 1, wherein a bottommost surface of the first layer is substantially level with a bottommost surface of the gate dielectric layer, and a topmost surface of the first layer is lower than a topmost surface of the gate stack.

7. The semiconductor device structure as claimed in claim 1, wherein a sidewall of the second layer is aligned with a sidewall of the source or drain structure.

8. The semiconductor device structure as claimed in claim 1, wherein the second layer covers an entirety of the source or drain structure.

9. The semiconductor device structure as claimed in claim 1, wherein a first sidewall of the first layer in direct contact with the gate stack is substantially aligned with a second sidewall of the second layer in direct contact with the gate stack, and a third sidewall of the first layer in direct contact with the source or drain structure is substantially aligned with a fourth sidewall of the second layer in direct contact with the source or drain structure.

10. A semiconductor device structure, comprising:
    a fin structure over a semiconductor substrate;
    a gate stack covering a portion of the fin structure;
    a spacer element over a sidewall of the gate stack, wherein the spacer element comprises a first layer and a second layer, the second layer is a single dielectric layer, a top surface of the first layer is lower than a top surface of the second layer, a dielectric constant of the first layer is greater than a dielectric constant of the second layer, and the gate stack is in contact with the first layer and the second layer;
    a source or drain structure over the semiconductor substrate, wherein the second layer extends from a sidewall of the source or drain structure to a top surface of the source or drain structure; and
    a dielectric layer over the source or drain structure, wherein the second layer is in direct contact with a top surface of the dielectric layer and a top surface of the gate stack.

11. The semiconductor device structure as claimed in claim 10, wherein the gate stack comprises a gate dielectric layer, and a dielectric constant of the gate dielectric layer is greater than the dielectric constant of the second layer.

12. The semiconductor device structure as claimed in claim 10, wherein a first sidewall of the first layer in direct contact with the gate stack is substantially aligned with a second sidewall of the second layer in direct contact with the gate stack, and a third sidewall of the first layer in direct contact with the source or drain structure is substantially aligned with a fourth sidewall of the second layer in direct contact with the source or drain structure.

13. A semiconductor device structure, comprising:
   a gate stack covering a fin structure and including a gate dielectric layer;
   a spacer element over a sidewall of the gate stack, wherein the spacer element comprises a first layer and a second layer, and wherein the second layer is separated from the fin structure by the first layer, a topmost surface of the first layer is in contact with a bottommost surface of the second layer, a dielectric constant of the first layer is greater than a dielectric constant of the second layer, and the gate dielectric layer of the gate stack is in contact with the first layer and the second layer;
   a source or drain structure over the fin structure, wherein the gate stack and the source or drain structure sandwich the second layer; and
   a dielectric layer over the source or drain structure, wherein the second layer is in direct contact with a top surface of the dielectric layer and a top surface of the gate stack.

14. The semiconductor device structure as claimed in claim 13, wherein the second layer extends over a top surface of the gate stack along the sidewall of the gate stack.

15. The semiconductor device structure as claimed in claim 13, wherein the dielectric layer surrounds the gate stack and the source or drain structure, and the second layer extends over an entirety of the top surface of the dielectric layer.

16. The semiconductor device structure as claimed in claim 15, further comprising an isolation feature surrounding a lower portion of the fin structure, wherein the dielectric layer is between the second layer extending over the dielectric layer and the isolation feature.

17. The semiconductor device structure as claimed in claim 13, wherein the first layer has a first width between the gate stack and the source or drain structure, and the second layer has a second width between the gate stack and the source or drain structure, and wherein the first width is substantially equal to the second width.

18. The semiconductor device structure as claimed in claim 13, wherein the first layer is thicker than the gate dielectric layer of the gate stack and thinner than the second layer.

19. The semiconductor device structure as claimed in claim 13, wherein the gate stack comprises a metal gate stack structure, and wherein the gate dielectric layer has a first portion sandwiched between the metal gate stack structure and the first layer and a second portion sandwiched between the metal gate stack structure and the second layer.

20. The semiconductor device structure as claimed in claim 13, wherein a first contact area between the first layer and a first portion of the sidewall of the gate stack is less than a second contact area between the second layer and a second portion of the sidewall of the gate stack, and the first portion of the sidewall of the gate stack is aligned with the second portion of the sidewall of the gate stack.

* * * * *